(12) United States Patent
Sakai et al.

(10) Patent No.: US 12,470,875 B2
(45) Date of Patent: Nov. 11, 2025

(54) PIEZOELECTRIC ELEMENT, PIEZOELECTRIC DEVICE, AND MANUFACTURING METHOD OF PIEZOELECTRIC ELEMENT

(71) Applicant: DENSO CORPORATION, Kariya (JP)

(72) Inventors: Minekazu Sakai, Kariya (JP); Kazuaki Mawatari, Kariya (JP)

(73) Assignee: DENSO CORPORATION, Kariya (JP)

( * ) Notice: Subject to any disclaimer, the term of this patent is extended or adjusted under 35 U.S.C. 154(b) by 250 days.

(21) Appl. No.: 18/343,903

(22) Filed: Jun. 29, 2023

(65) Prior Publication Data
US 2023/0345183 A1    Oct. 26, 2023

Related U.S. Application Data

(63) Continuation of application No. PCT/JP2022/010027, filed on Mar. 8, 2022.

(30) Foreign Application Priority Data

Mar. 10, 2021   (JP) ................ 2021-038409

(51) Int. Cl.
| | |
|---|---|
| *H04R 7/04* | (2006.01) |
| *H04R 3/00* | (2006.01) |
| *H04R 17/02* | (2006.01) |
| *H04R 29/00* | (2006.01) |
| *H04R 31/00* | (2006.01) |

(52) U.S. Cl.
CPC ............ *H04R 17/02* (2013.01); *H04R 3/00* (2013.01); *H04R 7/04* (2013.01); *H04R 29/004* (2013.01); *H04R 31/006* (2013.01)

(58) Field of Classification Search
CPC . H04R 17/02; H04R 3/00; H04R 7/04; H04R 29/004; H04R 31/006; H04R 2201/003; H04R 17/00; H04R 17/005; H04R 17/025; H04R 17/10; H10N 30/00–886; G01L 1/16–167; G01L 5/0019; G01L 5/167; G01L 9/0022; G01L 9/008; G01L 9/08; G01L 23/10
See application file for complete search history.

(56) References Cited

U.S. PATENT DOCUMENTS

| | | |
|---|---|---|
| 10,349,184 B2 | 7/2019 | Kuntzman et al. |
| 2008/0173092 A1* | 7/2008 | Hattori ............ G01P 15/0922 73/514.34 |

(Continued)

*Primary Examiner* — Mark Fischer
(74) *Attorney, Agent, or Firm* — Posz Law Group, PLC

(57) ABSTRACT

A piezoelectric element includes a support member and a vibrating portion. The vibrating portion has a support region supported by the support member, and a plurality of vibration regions, one end portion side of which is supported by the support region, and the other end portion side of which is opposite to the one end portion is floating from the support member. A first vibration region in which a mass on the one end portion side is heavier than the mass on the other end portion side serves as a pressure detection section outputting a first detection signal based on the charge of the piezoelectric film. A second vibration region in which a mass on the other end portion side is heavier than the mass on one end portion side serves as an acceleration detection section outputting a second detection signal based on the charge of the piezoelectric film.

11 Claims, 11 Drawing Sheets

(56) References Cited

U.S. PATENT DOCUMENTS

| | | |
|---|---|---|
| 2008/0205668 A1 | 8/2008 | Torii et al. |
| 2011/0159627 A1 | 6/2011 | Mantravadi et al. |
| 2012/0250909 A1* | 10/2012 | Grosh .................... H10N 30/05 |
| | | 381/174 |
| 2014/0191343 A1 | 7/2014 | Kasai et al. |
| 2015/0271606 A1 | 9/2015 | Grosh et al. |
| 2016/0221822 A1* | 8/2016 | Krumbein .............. H04R 19/04 |
| 2019/0281393 A1 | 9/2019 | Grosh et al. |
| 2020/0196065 A1* | 6/2020 | Pedersen .............. H04R 19/005 |
| 2022/0248145 A1 | 8/2022 | Grosh et al. |

* cited by examiner

PIEZOELECTRIC ELEMENT, PIEZOELECTRIC DEVICE, AND MANUFACTURING METHOD OF PIEZOELECTRIC ELEMENT

CROSS REFERENCE TO RELATED APPLICATIONS

The present application is a continuation application of International Patent Application No. PCT/JP2022/010027 filed on Mar. 8, 2022, which designated the U.S. and claims the benefit of priority from Japanese Patent Application No. 2021-038409 filed on Mar. 10, 2021, the entire disclosure of the above application is incorporated herein by reference.

TECHNICAL FIELD

The present disclosure relates to a piezoelectric element having a vibration region, a piezoelectric device, and a method for manufacturing a piezoelectric element.

BACKGROUND

A piezoelectric element having a vibration region has conventionally been proposed.

SUMMARY

An object of the present disclosure is to provide a piezoelectric element, a piezoelectric device, and a manufacturing method of a piezoelectric element, which can improve the detection accuracy.

According to one aspect of the present disclosure, a piezoelectric element includes a support member and a vibrating portion. The vibrating portion has a support region supported by the support member, and a plurality of vibration regions, one end portion side of which is supported by the support region, and the other end portion side of which is opposite to the one end portion is floating from the support member. The plurality of vibration regions includes a vibration region in which a mass on the one end portion side is heavier than the mass on the other end portion side, and which serves as a pressure detection section configured to output a first detection signal based on the charge of the piezoelectric film, and a vibration region in which a mass on the other end portion side is heavier than the mass on one end portion side, and which serves as an acceleration detection section configured to output a second detection signal based on the charge of the piezoelectric film.

DETAILED DESCRIPTION

Figure 1:
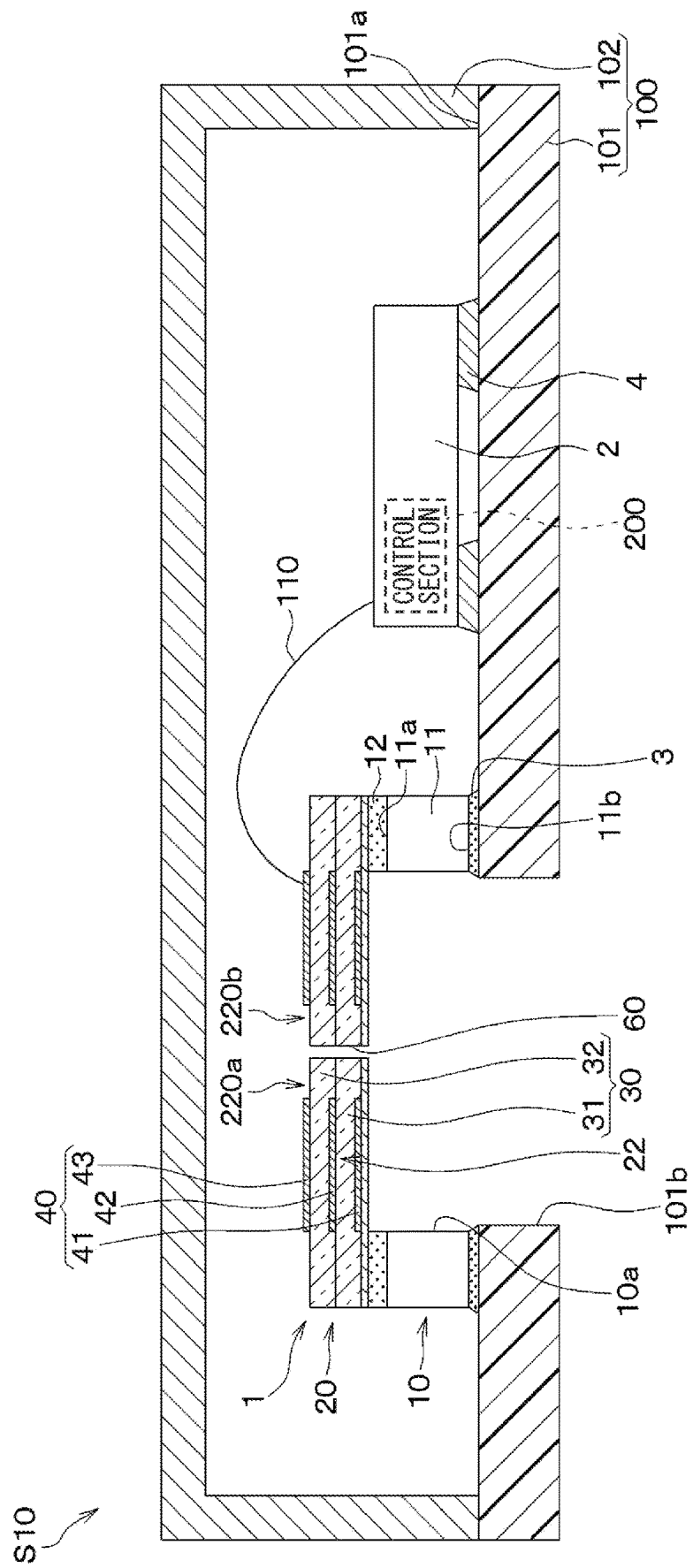
FIG. 1 is a cross-sectional view of a piezoelectric device according to a first embodiment.

In an assumable example, a piezoelectric element has a vibration region. Specifically, the piezoelectric element has a configuration in which a piezoelectric film and an electrode film electrically connected to the piezoelectric film are laminated on a support member. In the piezoelectric element, a recess is formed in the support member, and a part of the piezoelectric film and the electrode film constitutes is a floating region floating from the support member. Further, in this piezoelectric element, the floating region is divided into a plurality of regions by forming slit in the floating region, thereby forming vibration regions. Each vibration region is in a state of being cantilevered by the support member. Each vibration region has a substantially triangular planar shape, and the mass of one end on the support member side is made heavier than the mass of the other end opposite to one end.

By the way, in the piezoelectric element as described above, there is a demand for improving a detection accuracy on a low frequency side.

An object of the present disclosure is to provide a piezoelectric element, a piezoelectric device, and a manufacturing method of a piezoelectric element, which can improve the detection accuracy.

According to one aspect of the present disclosure, a piezoelectric element includes a support member and a vibrating portion. The vibrating portion has a support region supported by the support member, and a plurality of vibration regions, one end portion side of which is supported by the support region, and the other end portion side of which is opposite to the one end portion is floating from the support member. The plurality of vibration regions includes a vibration region in which a mass on the one end portion side is heavier than the mass on the other end portion side, and which serves as a pressure detection section configured to output a first detection signal based on the charge of the piezoelectric film, and a vibration region in which a mass on the other end portion side is heavier than the mass on one end portion side, and which serves as an acceleration detection section configured to output a second detection signal based on the charge of the piezoelectric film.

According to this configuration, in the acceleration detection section, the mass of the other end portion side is made heavier than the mass of the one end portion side. Therefore, the acceleration detection section has a low-frequency roll-off frequency than that in the pressure detection section. Therefore, when the frequency of the pressure to be detected is less than the predetermined threshold value, the pressure is detected using the second detection signal from the acceleration detection section, thereby improving the detection accuracy on the low frequency side.

According to another aspect of the present disclosure, a piezoelectric device includes the above-described piezoelectric element and a control section that performs predetermined processing. The control section calculates a frequency of the applied pressure based on the first detection signal and the second detection signal, compares the calculated frequency with a predetermined threshold value, detects the pressure based on the second detection signal when it is determined that the calculated frequency is less than the predetermined threshold value, and detects the pressure based on the first detection signal when it is determined that the calculated frequency is equal to or greater than the predetermined threshold value.

According to this configuration, the control section detects the pressure based on the second detection signal when determining that the frequency of the calculated pressure is less than the predetermined threshold value. Therefore, it is possible to improve the detection accuracy on the low frequency side.

According to another aspect of the present disclosure, a piezoelectric device includes a piezoelectric element and a control section that performs predetermined processing. The piezoelectric element has a support member and a vibrating portion. The vibrating portion is disposed on the support member and has a piezoelectric film and an electrode film electrically connected to the piezoelectric film, and a support region supported by the support member, and a plurality of vibration regions, one end portion side of which is supported by the support region, and the other end portion side of which is opposite to the one end portion is floating from the support member. A plurality of piezoelectric elements includes a piezoelectric element having a vibration region in which a mass on the one end portion side is larger than the mass on the other end portion side and serves as a pressure detection section that outputs a first detection signal based on the charge of the piezoelectric film, and a piezoelectric element having a vibration region in which a mass on the other end portion side is larger than the mass on the one end portion side and serves as an acceleration detection section that outputs a second detection signal based on the charge of the piezoelectric film. The control section calculates a frequency of the applied pressure based on the first detection signal and the second detection signal, compares the calculated frequency with a predetermined threshold value, detects the pressure based on the second detection signal when it is determined that the calculated frequency is less than the predetermined threshold value, and detects the pressure based on the first detection signal when it is determined that the calculated frequency is equal to or greater than the predetermined threshold value.

According to this configuration, in the acceleration detection section, the mass of the other end portion side is made heavier than the mass of the one end portion side. Therefore, the acceleration detection section has a low-frequency roll-off frequency than that in the pressure detection section. The control section detects the pressure based on the second detection signal when determining that the frequency of the calculated pressure is less than the predetermined threshold value. Therefore, it is possible to improve the detection accuracy on the low frequency side.

According to another aspect of the present disclosure, a manufacturing method of the above-described piezoelectric element includes preparing a support member, forming a piezoelectric film and an electrode film on the support member, forming a vibrating region constituent part by forming a slit that penetrates the piezoelectric film and reaches the support member, and forming a vibrating portion having a vibrating region by forming a recess portion on the opposite side of the support member from the piezoelectric film side and floating the vibrating region constituent part. When configuring the vibrating region by forming the slit, the slit is formed so that the vibration region in which a mass on the one end portion side is made heavier than the mass on the other end portion side and serving as the pressure detection section is configured, and the vibration region in which a mass on the other end portion side is made heavier than the mass on the one end portion side and serving as the acceleration detection section is configured.

According to this configuration, the pressure detection section and the acceleration detection section are formed in the same process by adjusting the shape of the slit. Therefore, the manufacturing process can be simplified.

Embodiments of the present disclosure will be described below with reference to the drawings. In the following embodiments, the same reference numerals are assigned to parts that are the same or equivalent to each other for description.

First Embodiment

The configuration of a piezoelectric device S10 of the first embodiment will be described with reference to FIGS. 1 to 3. In addition, the piezoelectric device S10 of the present embodiment is preferably used to detect pressure such as sound pressure of 1 to 20000 Hz, which is an audible range, and is preferably used by being mounted on a smart phone, an AI speaker, or the like. Also, the piezoelectric device S10 of the present embodiment is installed in an electronic device or the like that exhibits a wake-up function that can obtain an output according to displacement without a power source and is preferably used to detect the displacement.

As shown in FIG. 1, the piezoelectric device S10 of the present embodiment includes a piezoelectric element 1 and a circuit board 2 having a control section 200. The piezoelectric element 1 and the circuit board 2 are accommodated in a casing 100. First, the configuration of the piezoelectric element 1 of the present embodiment will be described.

Figure 2:
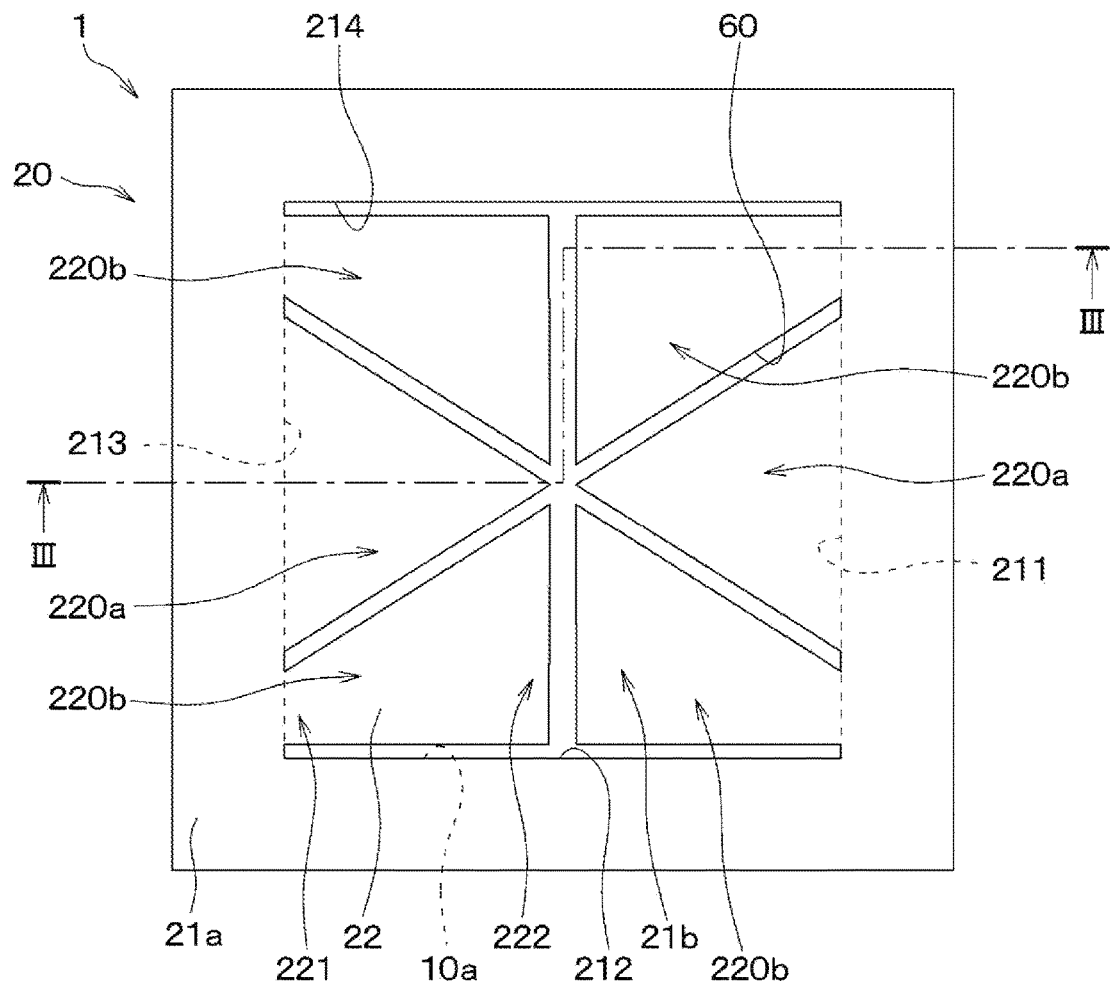
FIG. 2 is a plan view of the piezoelectric element shown in FIG. 1.
Figure 3:
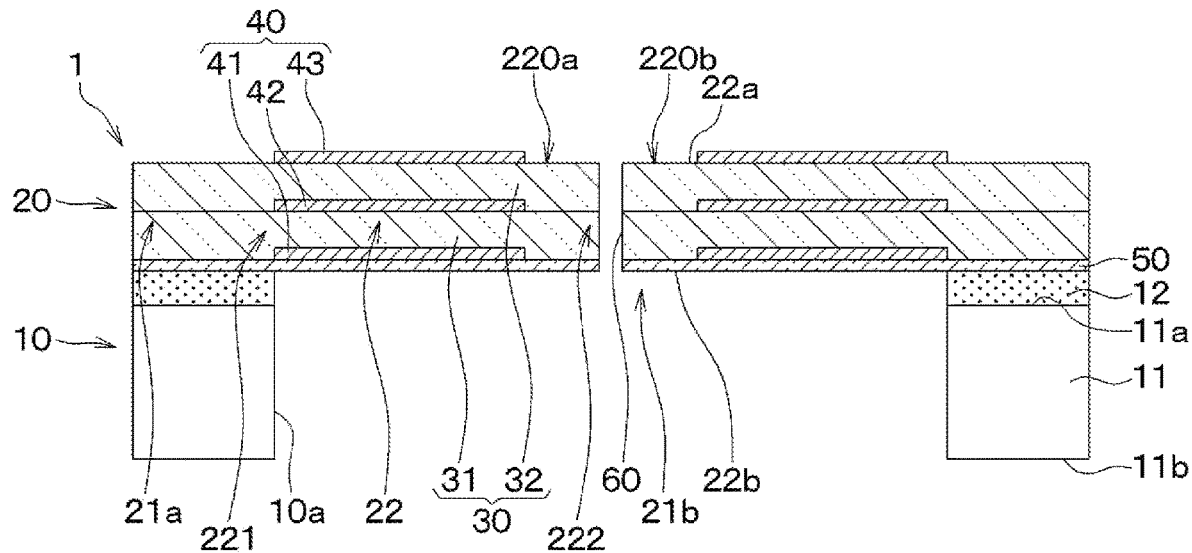
FIG. 3 is a cross-sectional view taken along a line III-III shown in FIG. 2.

As shown in FIGS. 2 and 3, the piezoelectric element 1 includes a support member 10 and a vibrating portion 20, and has a rectangular planar shape. The support member 10 includes a support substrate 11 having one surface 11a and the other surface 11b, and an insulating film 12 formed on the one surface 11a of the support substrate 11. The support substrate 11 is made of, for example, a silicon substrate, and the insulation film 12 is made of an oxide film or the like.

The vibrating portion 20 is arranged on the support member 10 and has a piezoelectric film 30 and an electrode film 40 electrically connected to the piezoelectric film 30. The piezoelectric film 30 is made of, for example, lead-free piezoelectric ceramics such as scandium aluminum nitride (ScAlN) or aluminum nitride (AlN). The electrode film 40 is made of molybdenum, copper, platinum, titanium, or the like.

In the present embodiment, the piezoelectric film 30 has a lower piezoelectric film 31 and an upper piezoelectric film 32 laminated on the lower piezoelectric film 31. Further, the electrode film 40 includes: a lower electrode film 41 arranged below the lower piezoelectric film 31, an intermediate electrode film 42 arranged between the lower piezoelectric film 31 and the upper piezoelectric film 32, and an upper electrode film 43 arranged on the upper piezoelectric film 32. That is, the vibrating portion 20 has a bimorph structure in which the lower piezoelectric film 31 is sandwiched between the lower electrode film 41 and the intermediate electrode film 42, and the upper piezoelectric film 32 is sandwiched between the intermediate electrode film 42 and the upper electrode film 43. The vibrating portion 20 then outputs a detection signal corresponding to a capacitance between the lower electrode film 41 and the intermediate electrode film 42 and a capacitance between the intermediate electrode film 42 and the upper electrode film 43.

Each electrode film 40 is formed in each vibration region 22, which will be described later, of the vibrating portion 20. Each electrode film 40 is appropriately connected to a wiring (not shown) formed in a support region 21a, which will be described later, of the vibrating portion 20, and is connected to the circuit board 2 via an electrode portion (not shown) formed in the support region 21a.

Further, the vibrating portion 20 of the present embodiment includes a base film 50 on which the lower piezoelectric film 31 and the lower electrode film 41 are disposed. That is, the piezoelectric film 30 and the electrode film 40 are disposed on the support member 10, with the base film 50 interposed between the piezoelectric film 30 and the electrode film 40. The base film 50 is not necessarily required, but it is provided to facilitate crystal growth when the lower piezoelectric film 31 and the like are formed. In the present embodiment, the base film 50 is made of aluminum nitride or the like. The piezoelectric film 30 has a thickness of about 1 μm, and the base film 50 has a thickness of about several tens nm. That is, the base film 50 is extremely thin with respect to the piezoelectric film 30.

In the support member 10, a recess portion 10a is formed for floating an inner edge side of the vibrating portion 20. The recess portion 10a corresponds to a recess. Therefore, the vibrating portion 20 has a structure with a support region 21a arranged on the support member 10 and a floating region 21b connected to the support region 21a and floating on the recess portion 10a. The recess portion 10a according to the present embodiment has a flat rectangular shape at the opening end at a side closer to the vibrating portion 20. Therefore, the shape of the inner edge of the support region 21a is a rectangle having first to fourth sides 211 to 214.

The floating region 21b includes a slit 60 that penetrates the floating region 21b in a thickness direction. In the present embodiment, the slit 60 divides the floating region 21b into six regions, and each divided region is cantilevered by the support region 21a. Each of the six divided regions functions as the vibration region 22. Each vibration region 22 is composed of the same constituent elements, and functions are divided according to the planar shape, although the details will be described later. Each vibrating region 22 vibrates to change the electric charge of the piezoelectric film 30, so that the electrode film 40 outputs a detection signal corresponding to the electric charge.

The configuration of each vibration region 22 in the present embodiment will be described below. Hereinafter, the end of each vibration region 22 that is a fixed end on the side of the support region 21a is referred to as one end portion 221, and the end of each vibration region 22 that is a free end on the side opposite to the support region 21a is referred to as the other end portion 222. In the following description, the surface of the vibration region 22 on the opposite side from the support member 10 is defined as one surface 22a of the vibration region 22, and the surface of the vibration region 22 on the support member 10 side is defined as the other surface 22b of the vibration region 22.

In the present embodiment, each of the six vibration regions 22 has a substantially triangular planar shape. Two vibration regions 22 of the six vibration regions 22 are formed such that the mass on the one end portion 221 side is heavier than the mass on the other end portion 222 side. In the present embodiment, the two vibration regions 22 have a substantially triangular planar shape as described above and are formed so that the one end portion 221 side is composed of one side connecting two apex angles and the other end portion 222 side is composed of one apex angle. In the two vibration regions 22, the width of the one end portion 221 side is larger than the width of the other end portion 222 side in the direction (hereinafter also simply referred to as the normal direction) normal to the one surface 22a and the other surface 22b of the vibration region 22. The width in the present embodiment is the length along the surface direction of the vibration region 22 in the direction intersecting with the extending direction of the vibration region 22 from the support region 21a side.

Such a vibrating region 22 vibrates according to the pressure directly applied to the vibration region 22 and outputs a detection signal based on the vibration. In other words, the vibration region 22 has a larger mass on the one end portion 221 side than on the other end portion 222 side, and outputs a detection signal corresponding to a state in which a uniformly distributed load is applied. In the following description, such a vibration region 22 is referred to as a pressure detection section 220a, and a detection signal output from the pressure detection section 220a is referred to as a first detection signal. The pressure detection section 220a has a smaller mass on the other end portion 222 side than the mass on the one end portion 221 side compared to the acceleration detection section 220b, which will be described later.

Four vibration regions 22 among the six vibration regions 22 are formed so that the mass on the other end portion 222 side is heavier than the mass on the one end portion 221 side. In the present embodiment, the four vibration regions 22 have a substantially triangular planar shape (in other words, a substantially trapezoidal planar shape) as described above and are formed so that the one end portion 221 side is composed of one apex angle and the other end portion 222 side is composed of the remaining two apex angle. In the four vibration regions 22, the width on the side of the other end portion 222 is wider than the width on the side of the one end portion 221 in the normal direction.

Compared with the pressure detection section 220a, the vibration region 22 has a larger mass on the other end portion 222 side, so that the vibration region 22 is less likely to vibrate due to the pressure directly applied to the vibration region 22. Such vibration region 22 outputs a detection signal corresponding to the acceleration based on the pressure applied to the entire piezoelectric element 1. In other words, the vibration region 22 has a mass on the other end portion 222 side larger than that on the one end portion 221 side, and outputs a detection signal corresponding to a state in which a tip load is applied. In the following description, such a vibration region 22 is referred to as an acceleration detection section 220b, and a detection signal output from the acceleration detection section 220b is referred to as a second detection signal. The detection signal corresponding to the acceleration based on the pressure applied to the entire piezoelectric element 1 is a signal based on a vibration due to pressure applied to the entire piezoelectric element 1, an air vibration, a vibration due to the weight of the other end portion 222 side, and the like. In addition, since the mass of the other end portion 222 side of the vibration region 22 is made heavier than the mass of the one end portion 221 side, the pressure that escapes through the slit 60 between the adjacent vibration regions 22 makes it difficult for the vibration regions 22 to vibrate.

As described above, the piezoelectric element 1 of the present embodiment is configured to have two pressure detection sections 220a and four acceleration detection sections 220b. In other words, the piezoelectric element 1 of the present embodiment is a so-called composite sensor. In the piezoelectric element 1 of the present embodiment, the pressure detection section 220a outputs a first detection signal based on the pressure directly applied to the vibration region 22, and the acceleration detection section 220b output the second detection signal based on the pressure or the like applied to the entire piezoelectric element 1. In the present embodiment, the four pressure detection sections 220a are connected in series and output one first detection signal. Similarly, the two acceleration detection sections 220b are connected in series and output one second detection signal.

Figure 4:
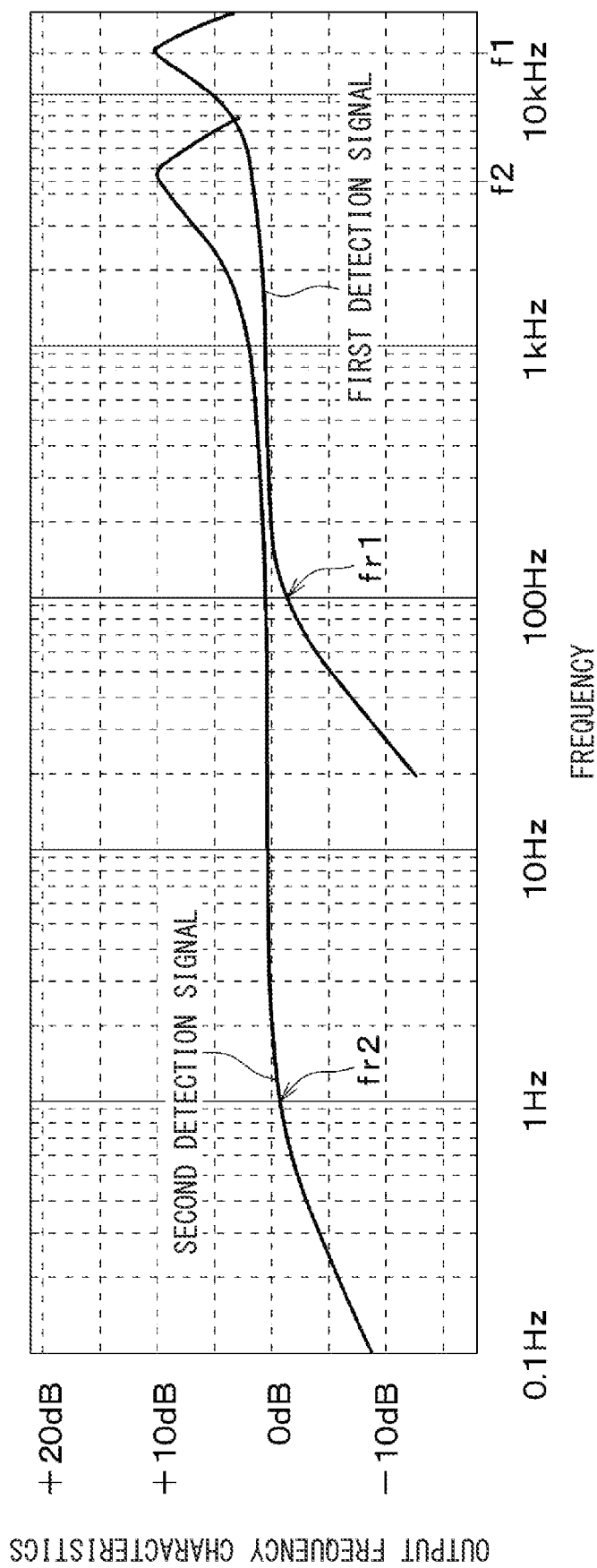
FIG. 4 is a diagram showing a relationship between frequency and output frequency characteristics.

Here, in the pressure detection section 220, the mass of the one end portion 221 side is larger than the mass of the other end portion 222 side, and in the acceleration detection section 220b, the mass of the other end portion 222 side is larger than the mass of the one end portion 221 side. Therefore, as shown in FIG. 4, the pressure detection section 220a and the acceleration detection section 220b have different low-frequency roll-off frequencies fr1 and fr2 and resonance frequencies f1 and f2. Specifically, the low roll-off frequency fr2 of the second detection signal output from the acceleration detection section 220b is lower than the low roll-off frequency fr1 of the first detection signal output from the pressure detection section 220a. For example, the low-frequency roll-off frequency fr2 of the second detection signal is approximately 1 Hz, and the low-frequency roll-off frequency fr1 of the first detection signal is approximately 100 Hz. Also, the resonance frequency f2 of the acceleration detection section 220b is lower than the resonance frequency f1 of the pressure detection section 220a. For example, the resonance frequency f2 of the acceleration detection section 220b is approximately 4.5 kHz, and the resonance frequency f1 of the pressure detection section 220a is approximately 13 KHz.

In FIG. 4, the output of the first detection signal output from the pressure detection section 220a when the frequency is 1 kHz is used as a reference (that is, 0 dB). Further, detailed numerical values of the low-frequency roll-off frequencies fr1 and fr2 and the resonance frequencies f1 and f2 can be appropriately changed by adjusting the width of the other end portion 222 side of the vibration region 22 and the like. However, when the pressure detection section 220a and the acceleration detection section 220b are configured with the magnitude relationship between the masses of the one end portion 221 and the other end portion 222 defined as described above, the low-frequency roll-off frequency fr2 of the second detection signal is lower than the low-frequency roll-off frequency fr1 of the first detection signal.

The pressure detection section 220a and the acceleration detection section 220b of the present embodiment are provided with one end portion 221 side supported by the first side 211 and the third side 213 facing each other in the support region 21a. Specifically, the first side 211 is provided with one pressure detection section 220a and two acceleration detection sections 220b. Specifically, one pressure detection section 220a is provided at a position including the center of the first side 211. The two acceleration detection sections 220b are provided on the first side 211 so as to interpose the pressure detection section 220a. Similarly, the third side 213 is provided with one pressure detection section 220a and two acceleration detection sections 220b. Specifically, one pressure detection section 220a is provided at a position including the center of the third side 213. The two acceleration detection sections 220b are provided on the third side 213 so as to interpose the pressure detection section 220a.

The above is the configuration of the piezoelectric element 1 in this embodiment.

The circuit board 2 performs predetermined processing and has the control section 200 in the present embodiment. The control section 200 is composed of a microcomputer having a CPU, storage units such as a ROM, a RAM, and a nonvolatile RAM, and is connected to the piezoelectric element 1. The control section 200 is configured so that the CPU reads and executes a program from the ROM or the non-volatile RAM to execute various control operations. Various data (for example, initial values, lookup tables, maps, etc.) used for program execution are stored in advance in the ROM or non-volatile RAM. The storage medium such as the ROM is a non-transitory tangible storage medium. CPU is an abbreviation for Central Processing Unit, ROM is an abbreviation for Read Only Memory, RAM is an abbreviation for Random Access Memory.

The control section 200 of the present embodiment calculates the frequency of the applied pressure based on the first detection signal output from the pressure detection section 220a and the second detection signal output from the acceleration detection section 220b. For example, the control section 200 calculates the frequency of the applied pressure by performing Fourier analysis based on the first detection signal and the second detection signal.

Then, when the control section 200 determines that the calculated frequency is equal to or higher than the predetermined threshold value, the control section 200 detects the applied pressure using the first detection signal. Further, when the control section 200 determines that the calculated frequency is less than the predetermined threshold value, the control section 200 detects the applied pressure using the second detection signal. The predetermined threshold value is set based on the low-frequency roll-off frequency fr1 of the pressure detection section 220a and is set to 100 Hz in the present embodiment, for example.

As shown in FIG. 1, the casing 100 includes a printed circuit board 101 on which the piezoelectric element 1 and a circuit board 2 are mounted, and a lid 102 fixed to the printed circuit board 101 in a manner to accommodate the piezoelectric element 1 and the circuit board 2. In the present embodiment, the printed circuit board 101 corresponds to a mounted member.

Although not illustrated, the printed circuit board 101 has a configuration in which a wiring portion, a through-hole electrode, and the like are appropriately formed, and electronic components such as a capacitor (not illustrated) are also mounted as necessary. In the piezoelectric element 1, the other surface 11b of the support substrate 11 is mounted on one surface 101a of the printed circuit board 101, with a bonding member 3, such as an adhesive, interposed between the other surface 11b and the one surface 101a. The circuit board 2 is mounted on the one surface 101a of the printed circuit board 101 via a bonding member 4 made of a conductive member. The piezoelectric element 1 and the circuit board 2 are electrically connected via a bonding wire 110. The lid 102 is made of metal, plastic, resin, or the like, and is fixed to the printed circuit board 101 to accommodate the piezoelectric element 1 and the circuit board 2, in which a bonding member, such as an adhesive (not illustrated), is interposed between the lid 102 and the circuit board 2.

Further, in the present embodiment, a through hole 101b is formed in a portion of the printed circuit board 101 that faces the vibration region 22 to allow the inside and outside of the casing 100 to communicate with each other. Specifically, the through hole 101b has a substantially cylindrical shape, and is formed such that its central axis matches up with a center of the vibrating portion 20 in the normal direction.

The above is the configuration of the piezoelectric device S10 in the present embodiment. Next, the operation of the piezoelectric device S10 will be described. When pressure is applied to the piezoelectric device S10 of the present embodiment, the pressure is introduced into the recess portion 10a through the through hole 101b while the piezoelectric device S10 vibrates as a whole. Since the charge of the piezoelectric film 30 changes when the pressure detection section 220a and the acceleration detection section 220b vibrate, the pressure detection section 220a and the acceleration detection section 220b output the first and second detection signals according to the change in the charge. Specifically, the pressure detection section 220a outputs the first detection signal based on the pressure introduced into the recess portion 10a from the through hole 101b. The acceleration detection section 220b outputs the second detection signal based on the pressure or the like applied to the entire piezoelectric device S10 (that is, the entire piezoelectric element 1).

The control section 200 performs the operations described above. Specifically, the control section 200 calculates the frequency of the applied pressure based on the first detection signal and the second detection signal. Then, when the calculated frequency is less than a predetermined threshold value, the pressure is detected using the second detection signal, and when the calculated frequency is greater than or equal to the predetermined threshold value, the pressure is detected using the first detection signal.

Figure 5A:
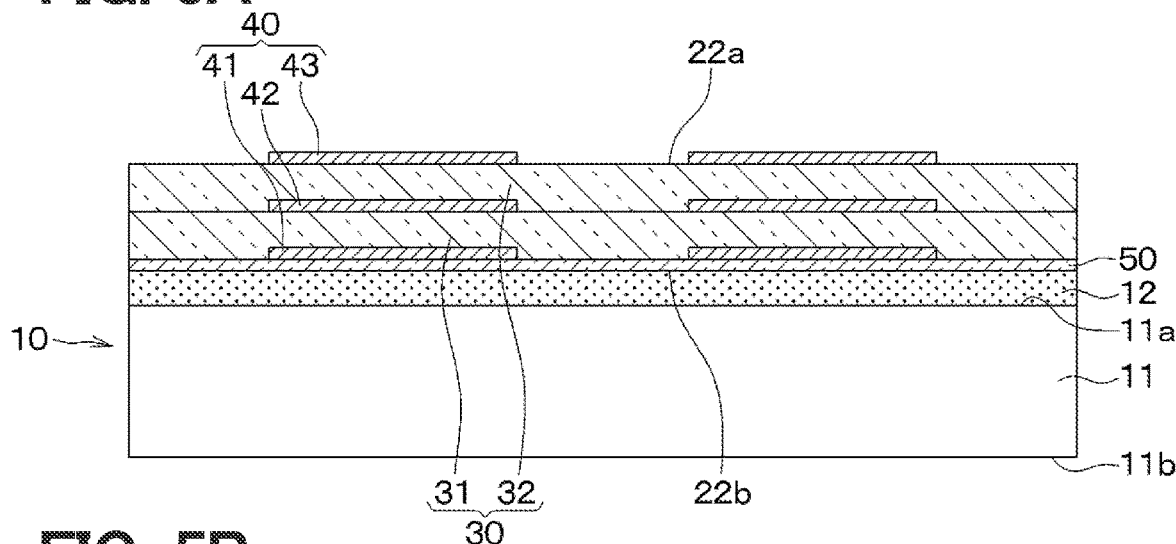
FIG. 5A is a cross-sectional view showing a method of manufacturing a piezoelectric element according to a first embodiment.
Figure 5B:
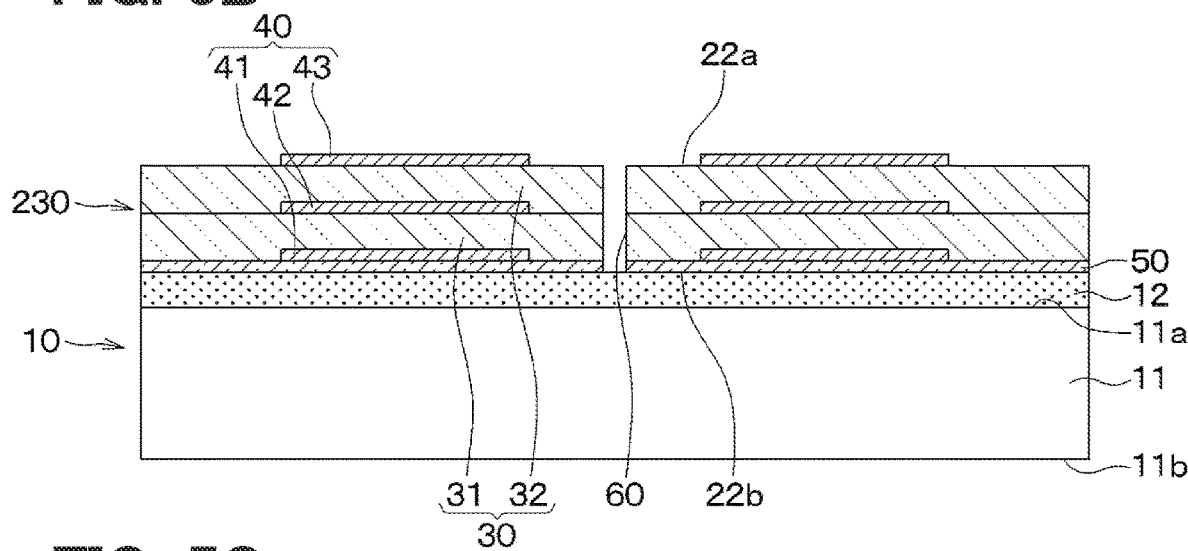
FIG. 5B is a cross-sectional view showing a method of manufacturing the piezoelectric element following FIG. 5A.
Figure 5C:
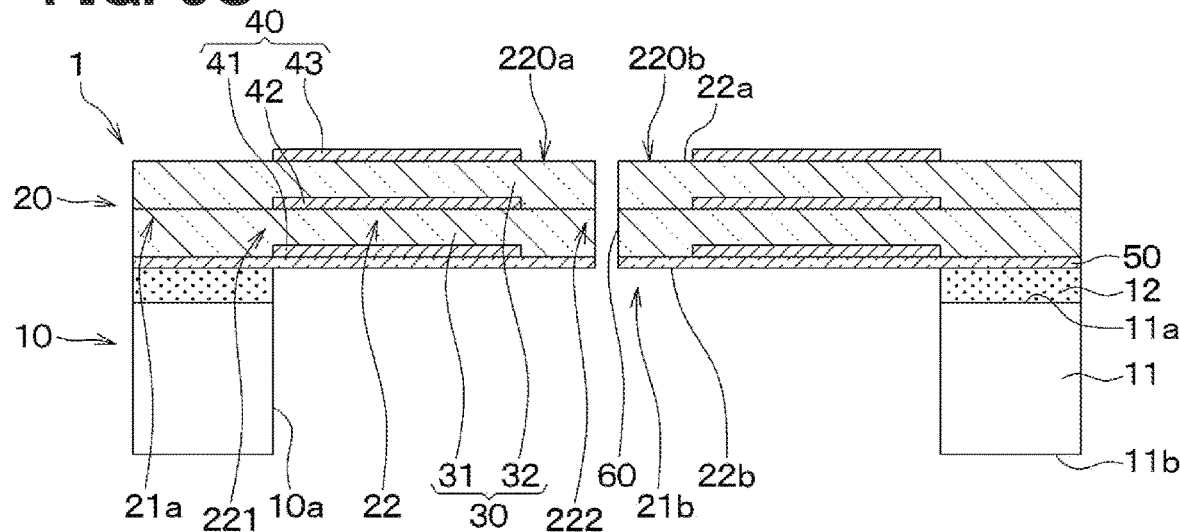
FIG. 5C is a cross-sectional view showing a method of manufacturing the piezoelectric element following FIG. 5B.

The following describes a method of manufacturing the piezoelectric element 1 with reference to FIGS. 5A to 5C. FIGS. 5A to 5C are cross-sectional views of a portion corresponding to FIG. 3.

First, as illustrated in FIG. 5A, the base film 50, the piezoelectric film 30, the electrode film 40, and the like are formed on the support member 10 having the support substrate 11 and the insulating film 12. That is, a material in which the recess portion 10a and the slit 60 are not formed in the piezoelectric element 1 illustrated in FIG. 3 is prepared. The piezoelectric film 30, the electrode film 40 configured in the process of FIG. 5A are portions that form the vibrating portion 20. Therefore, in FIG. 5A, the same reference numerals as those of the one surface 22a and the other surface 22b of the vibration region 22 are attached.

Next, as illustrated in FIG. 5B, anisotropic dry etching is performed using a mask (not illustrated) to form the slit 60 that penetrate the piezoelectric film 30 and reach the support member 10. As a result, a vibration region constituent part 230 to be the vibration region 22 is configured by forming the recess portion 10a to be described later. In addition, when the vibration region 22 is configured, the slit 60 is formed so as to configure the pressure detection section 220a in which the mass on the one end portion 221 side is heavier than the mass on the other end portion 222 side and the acceleration detection section 220b in which the mass on the other end portion 222 side is heavier than the mass on the one end portion 221 side. That is, in the present embodiment, the pressure detection section 220a and the acceleration detection section 220b are separated only by the shape of the slit 60 and have the same configuration other than the planar shape.

The vibration region constituent part 230 is a portion to be the vibration region 22 with the formation of the recess portion 10a. For this reason, in the drawing, the one surface and the other surface of the vibration region constituent part 230 are given the same reference numerals as the one surface 22a and the other surface 22b of the vibration region 22, respectively.

Subsequently, as illustrated in FIG. 5C, etching is performed using a mask (not illustrated) to penetrate the insulating film 12 from the other surface 11b of the support substrate 11 and reach the base film 50, thereby forming the recess portion 10a. In the present embodiment, after the support substrate 11 is removed by anisotropic dry etching, the insulating film 12 is removed by isotropic wet etching to form the recess portion 10a. As a result, the vibration region constituent part 230 floats from the support member 10 to form the vibration region 22, and the piezoelectric element 1 illustrated in FIG. 1 is manufactured.

In addition, since the slit 60 is formed as described above, the configured vibration region 22 is configured to have the pressure detection section 220a and the acceleration detection section 220b. In this step, although not illustrated, a protective resist or the like covering the upper piezoelectric film 32 and the upper electrode film 43 may be disposed to form the recess portion 10a. According to this configuration, when forming the recess portion 10a, it can suppress that the vibration region 22 is destroyed. The protective resist is removed after the recess portion 10a is formed.

Figure 6:
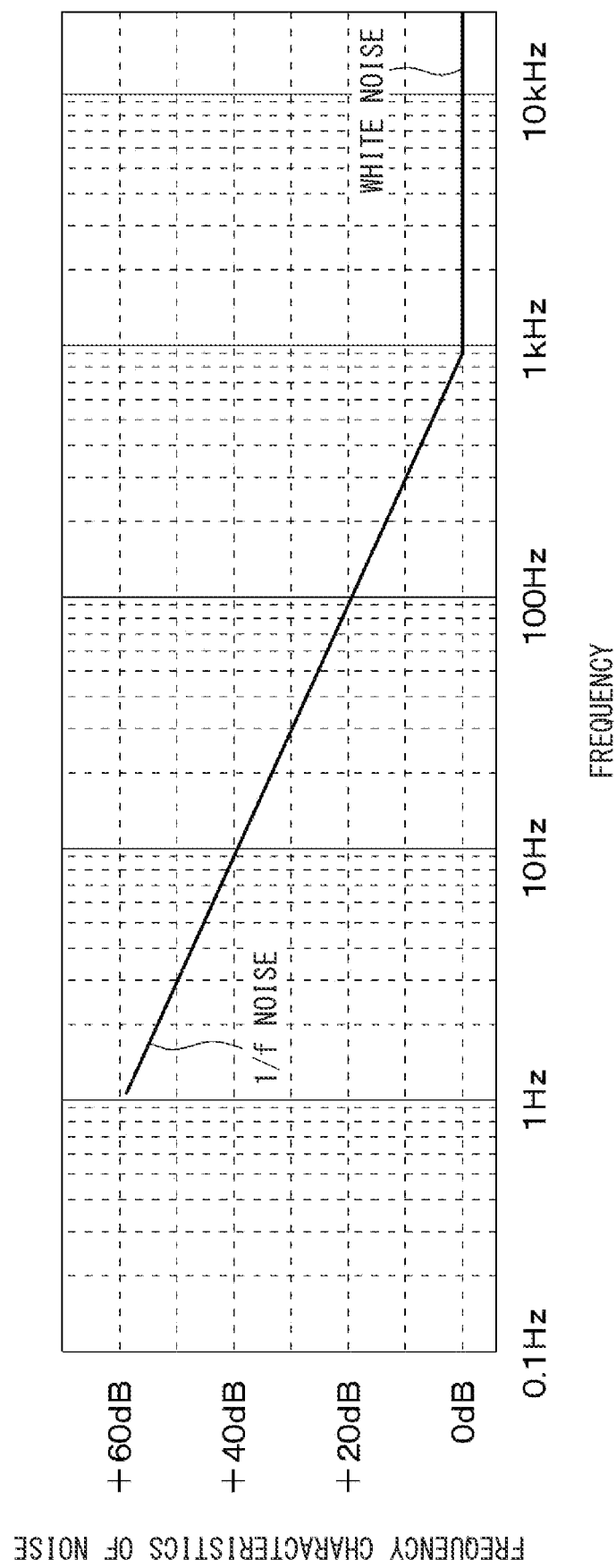
FIG. 6 is a diagram showing a relationship between frequency and frequency characteristics of noise.

According to the present embodiment described above, the piezoelectric device S10 has the pressure detection section 220a and the acceleration detection section 220b. Therefore, the detection accuracy can be improved. That is, when the piezoelectric element 1 includes only the pressure detection section 220a in which the mass on the one end portion 221 side is larger than the mass on the other end portion 222 side, the detection signal output from the pressure detection section 220a is shown in FIG. 6. In FIG. 6, the output when the frequency is 1 kHz is referred to as the reference (that is, 0 dB).

As shown in FIG. 6, the detection signal is a constant signal containing white noise at frequencies higher than 1 kHz, but the detection signal becomes a signal whose 1/f noise increases as the frequency decreases at frequencies lower than 1 kHz. That is, the detection accuracy of the detection signal from the pressure detection section 220a decreases as the frequency decreases. The cause of this phenomenon is that when the pressure is at a low frequency, the mass on the one end portion 221 side of the pressure detection section 220a is made heavier than the mass on the other end portion 222 side, so the pressure coming out of the slit 60 has a greater influence. Therefore, in the present embodiment, in addition to the pressure detection section 220a, the acceleration detection section 220b is provided. Further, In the acceleration detection section 220b, the mass of the other end portion 222 side is made heavier than the mass of the one end portion 221 side, and the low-frequency roll-off frequency fr2 of the second detection signal is lower than the low-frequency roll-off frequency fr1 of the first detection signal. Then, the piezoelectric device S10 detects the pressure based on the second detection signal when the pressure is less than the predetermined threshold value. Therefore, in the piezoelectric device S10 of the present embodiment, the low-frequency pressure that lowers the detection accuracy of the pressure detection section 220a is detected based on the second detection signal from the acceleration detection section 220b. can be improved. Therefore, it is possible to improve detection accuracy on the low frequency side. Further, by improving detection accuracy on the low frequency side, AOP (abbreviation of Acoustic Over Point) can be improved.

(1) In the present embodiment, the pressure detection section 220a and the acceleration detection section 220b are supported by the common support region 21a. That is, the pressure detection section 220a and the acceleration detection section 220b are arranged on the common support member 10. Therefore, the number of parts can be reduced as compared with the case where the pressure detection section 220a and the acceleration detection section 220b are formed in separate piezoelectric elements 1 to form the piezoelectric device S10.

(2) In the present embodiment, the pressure detection section 220a and the acceleration detection section 220b have different functions according to their planar shapes and have the same basic components. Therefore, simplification of the configuration can be achieved. Further, when manufacturing such a piezoelectric element 1, the pressure detection section 220a and the acceleration detection section 220b are formed in the same process by adjusting the shape of the slit 60. Therefore, the manufacturing process can be simplified.

Second Embodiment

A second embodiment will be described. In the present embodiment, the piezoelectric element 1 is provided with a temperature detection section, as compared with the first embodiment. Descriptions of the same configurations and processes as those of the first embodiment will not be repeated hereinafter.

Figure 7:
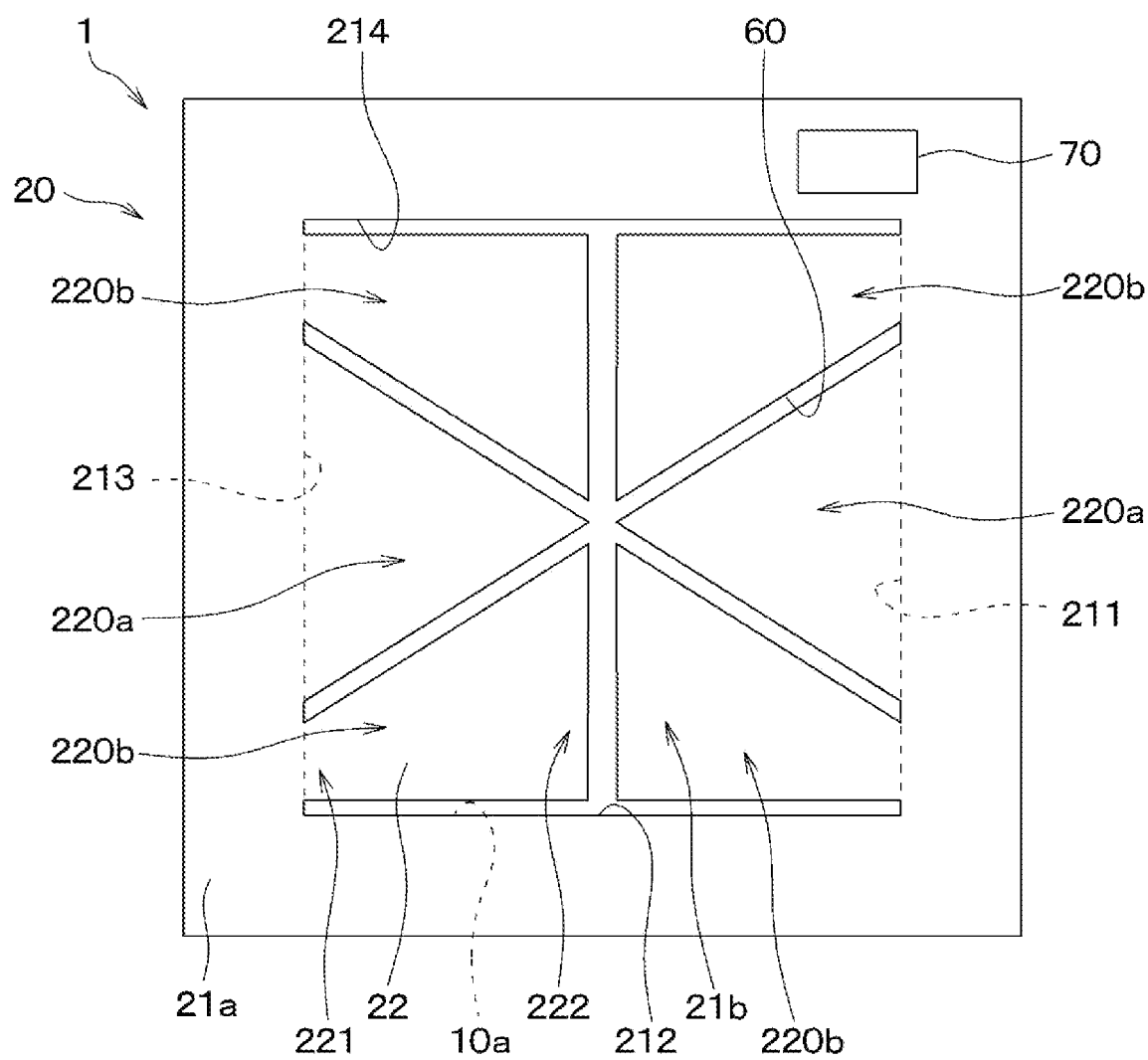
FIG. 7 is a plan view of a piezoelectric element according to a second embodiment.

In the piezoelectric element 1 of the present embodiment, as shown in FIG. 7, the support region 21a of the piezoelectric element 1 is provided with a temperature detection section 70. The temperature detection section 70 is composed of a temperature sensitive resistor or the like whose resistance value changes according to the temperature.

The control section 200 of the present embodiment is connected to the temperature detection section 70 and performs predetermined temperature correction based on the temperature detection signal from the temperature detection section 70. Specifically, the vibration region 22 is configured by laminating the piezoelectric film 30 and the electrode film 40 as described above. Therefore, the vibration region 22 may warp when the ambient temperature changes due to the use environment or the like because the piezoelectric film 30 and the electrode film 40 have different coefficients of linear expansion. Therefore, the control section 200 calculates the warp of the vibration region 22 from the temperature detection signal, performs temperature correction based on the calculated warp, and detects the pressure.

In the present embodiment, the relationship between the temperature and the warp of the vibration region 22 is calculated in advance by experiments or the like, and auxiliary data regarding the temperature and the warp of the vibration region 22 is stored in the control section 200. Then, the control section 200 calculates the warp of the vibration region 22 based on the temperature detection signal and the auxiliary data and performs temperature correction for calculating a correction signal that reduces the influence of the warp from the first detection signal and the second detection signal and detect the pressure using the correction signal. The direction and magnitude of the warp of the vibration region 22 change depending on the temperature, the material and thickness of the piezoelectric film 30 and the electrode film 40, and the like. Therefore, the auxiliary data is preferably created in consideration of the actual material, thickness, etc. of the piezoelectric film 30 and the electrode film 40.

According to the present embodiment described above, the piezoelectric element 1 is provided with the pressure detection section 220a and the acceleration detection section 220b. Since the control section 200 detects the pressure based on the predetermined threshold value, it is possible to prevent the detection accuracy from deteriorating.

(1) In the present embodiment, the support region 21a of the piezoelectric element 1 is provided with the temperature detection section 70. Then, the control section 200 performs the temperature correction based on the temperature detection signal. Therefore, according to the piezoelectric device S10 of the present embodiment, detection accuracy can be further improved.

Third Embodiment

A third embodiment will be described. The present embodiment differs from the first embodiment in the configurations of the pressure detection section 220a and the acceleration detection section 220b. Descriptions of the same configurations and processes as those of the first embodiment will not be repeated hereinafter.

Figure 8:
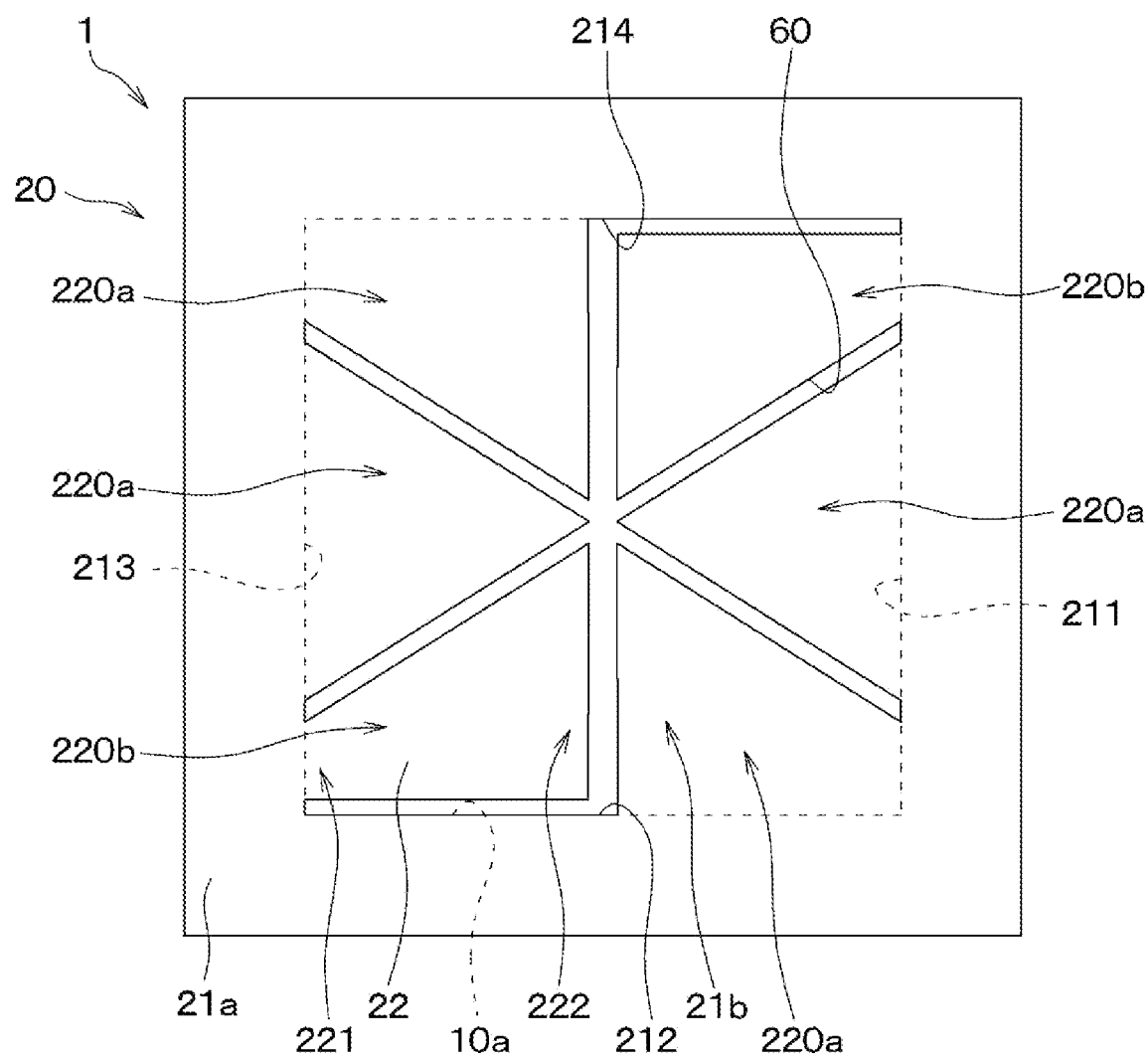
FIG. 8 is a plan view of a piezoelectric element according to a third embodiment.

In the piezoelectric element 1 of the present embodiment, as shown in FIG. 8, four pressure detection sections 220a and two acceleration detection sections 220b are formed. Specifically, the first side 211 is provided with one acceleration detection section 220b on the fourth side 214 side and one pressure detection section 220a on the second side 212 side. A portion including the boundary between the first side 211 and the second side 212 is provided with one pressure detection section 220a. The third side 213 is provided with one acceleration detection section 220b on the second side 212 side and one pressure detection section 220a on the fourth side 214 side. A portion including the boundary between the third side 213 and the fourth side 214 is provided with one pressure detection section 220a.

According to the present embodiment described above, the piezoelectric element 1 is provided with the pressure detection section 220a and the acceleration detection section 220b. Since the control section 200 detects the pressure based on the predetermined threshold value, it is possible to prevent the detection accuracy from deteriorating. As in the present embodiment, the number of pressure detection sections 220a and acceleration detection sections 220b can be changed as appropriate.

Fourth Embodiment

A fourth embodiment will be described. The present embodiment differs from the third embodiment in the arrangements of the pressure detection section 220a and the acceleration detection section 220b. The other configurations of the present embodiment are similar to those of the third embodiment, and therefore a description of the similar configurations will not be repeated.

Figure 9:
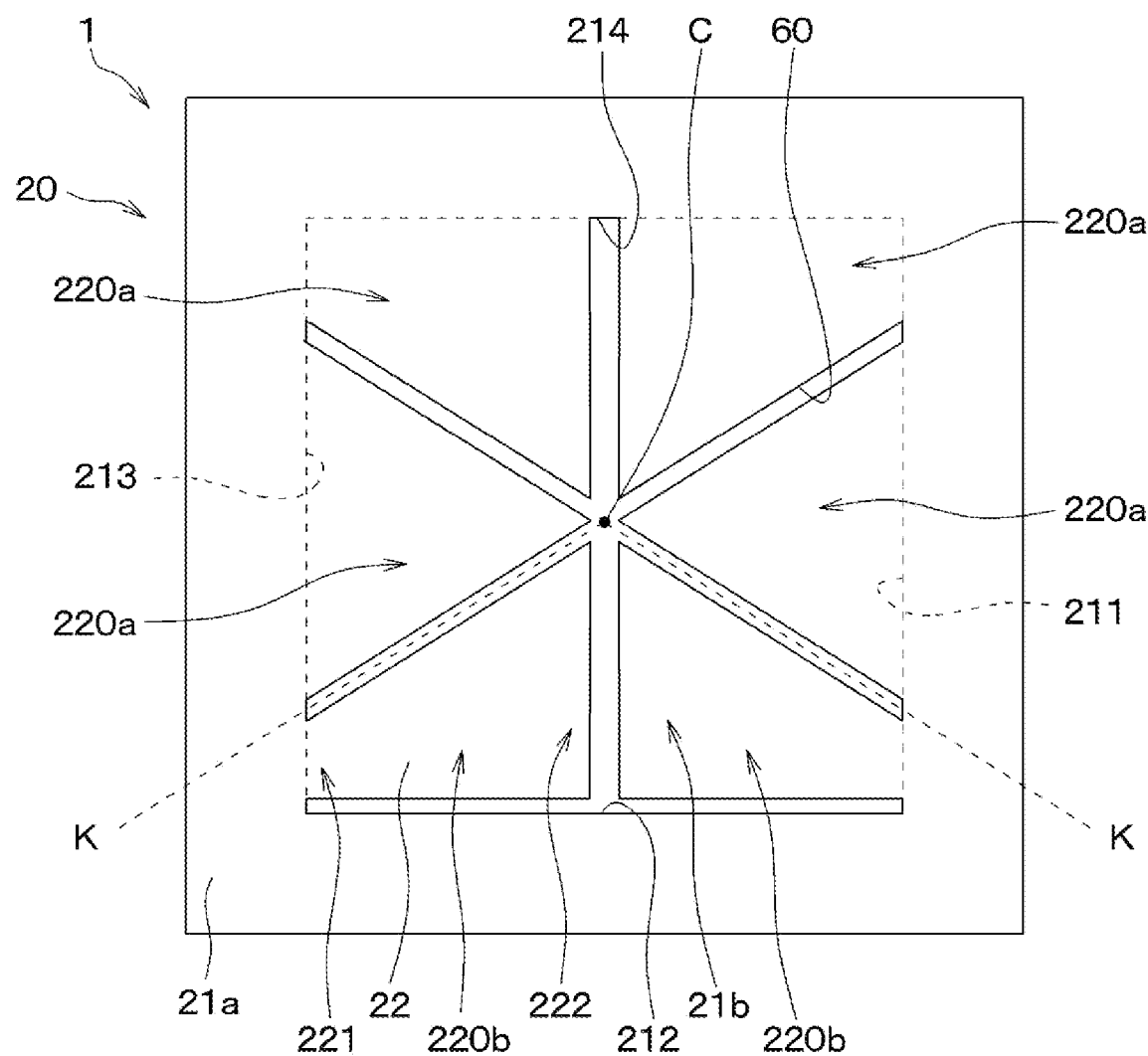
FIG. 9 is a plan view of a piezoelectric element according to a fourth embodiment.

As shown in FIG. 9, in the piezoelectric element 1 of the present embodiment, the four pressure detection sections 220a are collectively arranged in one region with respect to a virtual line K connecting two predetermined locations on the inner edge side of the support region 21a. Also, in the piezoelectric element 1, two acceleration detection sections 220b are collectively arranged in the other region with respect to the virtual line K.

The virtual line K in the present embodiment is a polygonal line that connects a central portion C of the floating region 21b and two locations on the inner edge portion of the support region 21a. However, the virtual line K may be a straight line, or may be a line that does not pass through the central portion C.

According to the present embodiment described above, the piezoelectric element 1 is provided with the pressure detection section 220a and the acceleration detection section 220b. Since the control section 200 detects the pressure based on the predetermined threshold value, it is possible to prevent the detection accuracy from deteriorating.

(1) In the present embodiment, the pressure detection section 220a and the acceleration detection section 220b are collectively arranged. Therefore, it is possible to facilitate routing of the wirings formed in the support region 21a and connected to the electrode film 40, thereby simplifying the configuration.

Fifth Embodiment

A fifth embodiment will be described. In the present embodiment, the configuration of the piezoelectric device S10 is changed from the first embodiment. Descriptions of the same configurations and processes as those of the first embodiment will not be repeated hereinafter.

Figure 10:
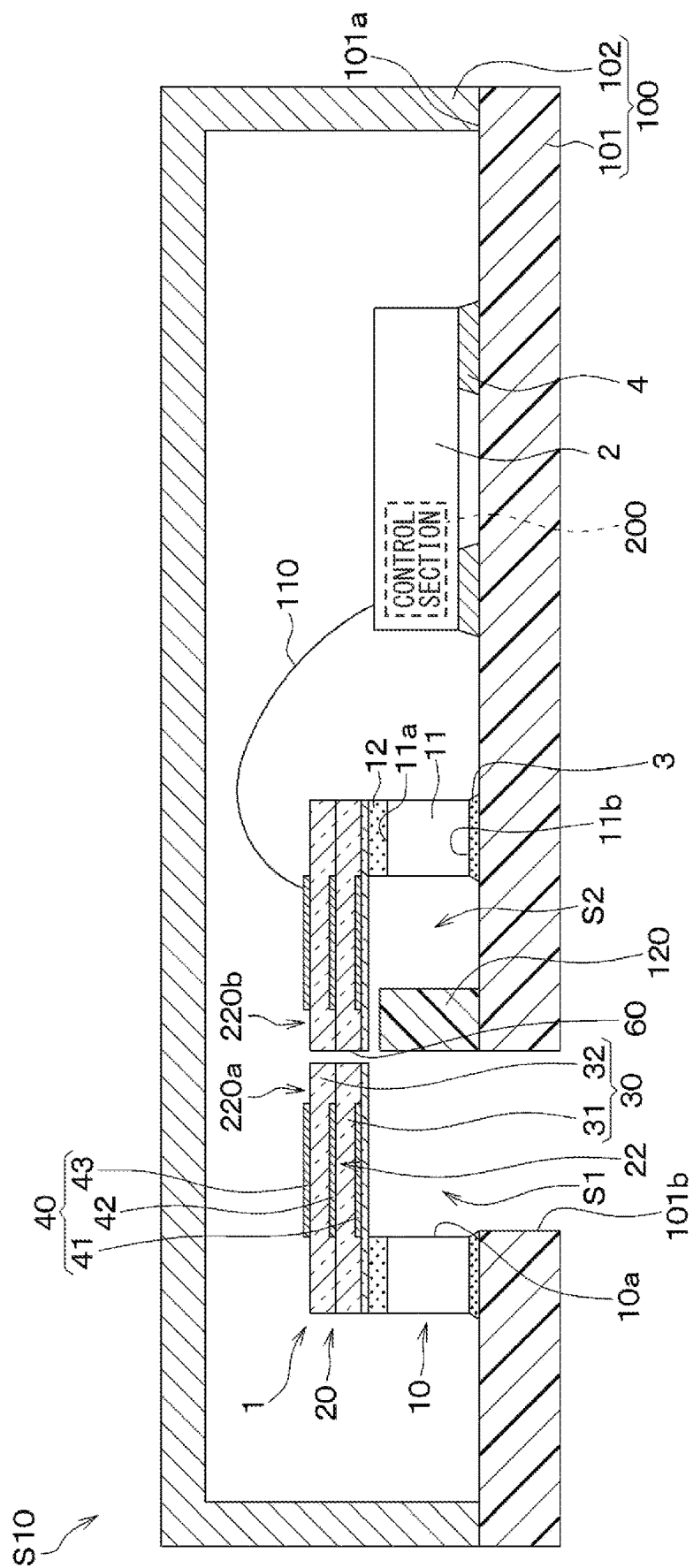
FIG. 10 is a cross-sectional view of a piezoelectric device according to the fifth embodiment.

In the piezoelectric device S10 of the present embodiment, as shown in FIG. 10, the through hole 101b is formed in a portion facing the pressure detection section 220a and is not formed in a portion facing the acceleration detection section 220b. That is, in the through holes 101b of the present embodiment, the distance between the opposing side surfaces is narrower than that in the first embodiment.

A partition wall 120 is arranged around the through hole 101b of the printed circuit board 101. Specifically, the partition wall 120 is arranged on the printed circuit board 101 so that a first space S1 surrounded by the pressure detection section 220a and the printed circuit board 101 and a second space S2 surrounded by the acceleration detection section 220b and the printed circuit board 101 are divided. In other words, the printed circuit board 101 is provided with the partition wall 120 that separates a portion facing the pressure detection section 220a from a portion facing the acceleration detection section 220b. The partition wall 120 is configured by, for example, placing a potting material made of a resin material at a predetermined location on the printed circuit board 101. Further, the separation here includes the case where the first space S1 and the second space S2 are communicated with each other through a gap or the like.

According to the present embodiment described above, the piezoelectric element 1 is provided with the pressure detection section 220a and the acceleration detection section 220b. Since the control section 200 detects the pressure based on the predetermined threshold value, it is possible to prevent the detection accuracy from deteriorating.

(1) In the present embodiment, the first space S1 and the second space S2 are separated. Therefore, the pressure introduced into the recess portion 10a through the through hole 101b is less likely to be directly applied to the acceleration detection section 220b, and the acceleration detection section 220b is less likely to vibrate due to the pressure. Then, the second detection signal is less likely to be affected by vibration caused by the pressure introduced into the recess portion 10a from the through hole 101b. Therefore, it is possible to further improve the detection accuracy.

Sixth Embodiment

A sixth embodiment will be described hereafter. In the present embodiment, the configuration of the piezoelectric device S10 is changed from the fifth embodiment. Descriptions of the same configurations and processes as those of the fifth embodiment will not be repeated hereinafter.

Figure 11:
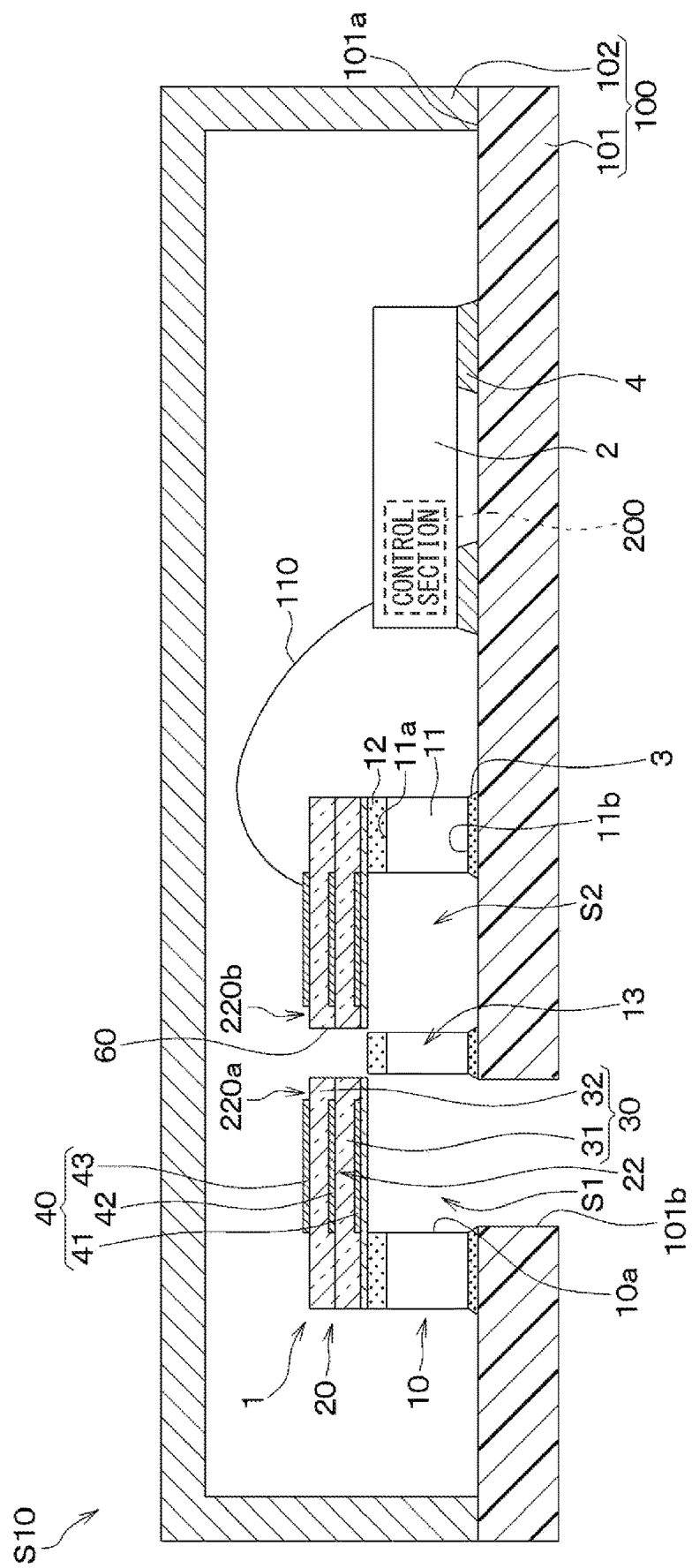
FIG. 11 is a cross-sectional view of a piezoelectric device according to a sixth embodiment.

In the piezoelectric device S10 of the present embodiment, as shown in FIG. 11, the recess portion 10a is formed so as to have a partition wall 13 that separates the first space S1 and the second space S2. In other words, the recess portion 10a has the partition wall 13 that separates the first space S1 surrounded by the pressure detection section 220a and the support member 10 and the second space S2 surrounded by the acceleration detection section 220b and the support member 10. In other words, the partition wall 13 is arranged in the space within the recess portion 10a so as to separate the first space S1 on the side of the pressure detection section 220a from the second space S2 on the side of the acceleration detection section 220b. In addition, the partition wall 120 in the fifth embodiment is not formed in the present embodiment. Moreover, the partition wall 13 of the present embodiment is composed of the support substrate 11 and the insulating film 12.

According to the present embodiment described above, the piezoelectric element 1 is provided with the pressure detection section 220a and the acceleration detection section 220b. Since the control section 200 detects the pressure based on the predetermined threshold value, it is possible to prevent the detection accuracy from deteriorating. Moreover, even if the partition wall 13 is provided in the piezoelectric element 1, the same effects as those of the fifth embodiment can be obtained.

Other Embodiments

Although the present disclosure has been described in accordance with the embodiments, it is understood that the present disclosure is not limited to such embodiments or structures. The present disclosure encompasses various modifications and variations within the scope of equivalents. In addition, various combinations and configurations, as well as other combinations and configurations that include only one element, more, or less, are within the scope and spirit of the present disclosure.

For example, in the first embodiment, the pressure detection section 220a and the acceleration detection section 220b may be arranged on different support members 10. That is, in the first embodiment, two piezoelectric elements 1 may be provided, one of the piezoelectric elements 1 may be provided with the pressure detection section 220a, and the other piezoelectric element 1 may be provided with the acceleration detection section 220b. In such a configuration, the through hole 101b may be formed so as to communicate with the recess portion 10a of the piezoelectric element 1 in which the pressure detection section 220a is formed.

Further, in each of the above-described embodiments, the control section 200 does not have to be provided on the circuit board 2. For example, the control section 200 may be provided in another circuit section arranged outside casing 100.

In each of the embodiments described above, the number of pressure detection sections 220a and acceleration detection sections 220b can be changed as appropriate. For example, one pressure detection section 220a and one acceleration detection section 220b may be formed.

For example, in each of the above embodiments, the vibrating portion 20 may include at least one layer of the piezoelectric film 30 and at least one layer of the electrode film 40. The planar shape of the piezoelectric element 1 does not have to be a rectangular shape but may be a polygonal shape, such as a pentagonal shape or a hexagonal shape. Furthermore, the planar shape of the floating region 21b may be a polygonal shape such as a substantially pentagonal shape or a substantially hexagonal shape instead of the substantially rectangular shape.

Figure 12:
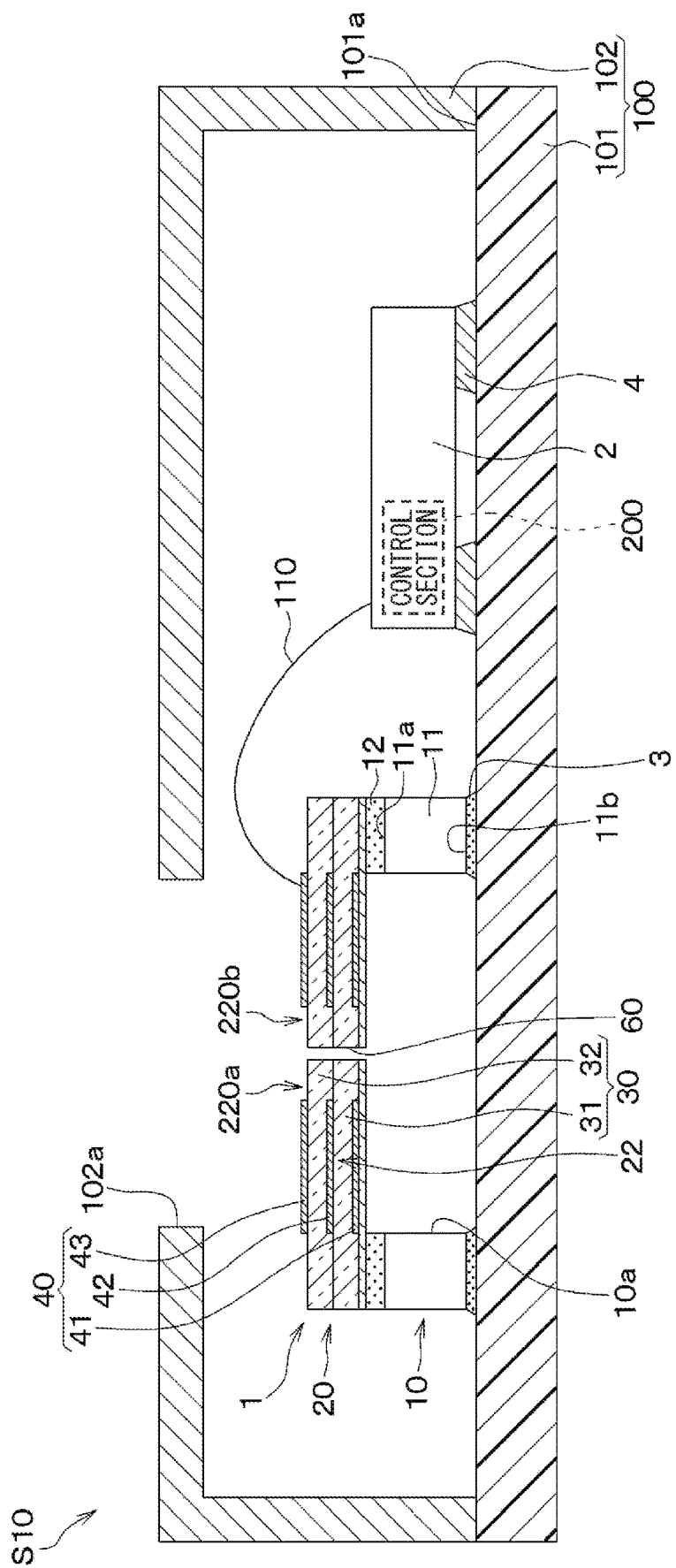
FIG. 12 is a cross-sectional view of a piezoelectric device according to another embodiment.

Furthermore, in the above-described first to fifth embodiments, as shown in FIG. 12, a through hole 102a may be formed in the lid 102. In addition, when forming the through hole 102a in the lid 102 in the fifth embodiment, the lid 102 should just be equipped with the partition wall.

Further, each of the above embodiments may be combined as appropriate. For example, the second embodiment may be combined with the third to sixth embodiments, and the temperature detection section 70 may be provided. The third embodiment may be combined with the fifth and sixth embodiments, and the numbers of the pressure detection sections 220a and the acceleration detection sections 220b may be changed. The fourth embodiment may be combined with the fifth and sixth embodiments to collectively arrange the pressure detection sections 220a and collectively arrange the acceleration detection sections 220b. The fifth embodiment may be combined with the sixth embodiment, and the partition wall 120 may be arranged on the printed circuit board 101 and the partition wall 13 may be arranged on the piezoelectric element 1.

The control section and the method thereof described in the present disclosure are realized by a dedicated computer provided by configuring a processor and a memory programmed to execute one or more functions embodied by a computer program. May be done. Alternatively, the controller and the method described in the present disclosure may be implemented by a special purpose computer configured as a processor with one or more special purpose hardware logic circuits. Alternatively, the controller and the method described in the present disclosure may be implemented by one or more special purpose computer, which is configured as a combination of a processor and a memory, which are programmed to perform one or more functions, and a processor which is configured with one or more hardware logic circuits. The computer programs may be stored, as instructions to be executed by a computer, in a tangible non-transitory computer-readable medium.

What is claimed is:

1. A piezoelectric element for detecting pressure, comprising:
    a support member; and
    a vibrating portion disposed on the support member and having a piezoelectric film and an electrode film electrically connected to the piezoelectric film, wherein
    the vibrating portion has a support region supported by the support member, and a plurality of vibration regions, one end portion side of which is supported by the support region, and the other end portion side of which is opposite to the one end portion is floating from the support member, and
    the plurality of vibration regions includes
        a first vibration region in which a mass on the one end portion side is heavier than the mass on the other end portion side, and which serves as a pressure detection section configured to output a first detection signal based on a charge of the piezoelectric film, and
        a second vibration region in which a mass on the other end portion side is heavier than the mass on one end portion side, and which serves as an acceleration detection section configured to output a second detection signal based on a charge of the piezoelectric film,
    wherein the first vibration region and the second vibration region are arranged adjacent to each other and have a same thickness in a thickness direction.

2. The piezoelectric element according to claim 1, wherein
    a temperature detection section configured to output a temperature detection signal corresponding to temperature is arranged in the support region.

3. The piezoelectric element according to claim 1, wherein
    a line extending in a direction along a surface direction of the vibration region and passing through two predetermined locations in the support region is defined as a virtual line, and
    the pressure detection sections are collectively arranged on one side with respect to the virtual line, and the acceleration detection sections are collectively arranged on the other side with respect to the virtual line.

4. The piezoelectric element according to claim 1, wherein
    the support member has a recess portion for floating the vibration region from the support member and,
    the recess portion has a partition wall that separates a first space surrounded by the pressure detection section and the support member from a second space surrounded by the acceleration detection section and the support member.

5. A piezoelectric device for detecting pressure, comprising:
    the piezoelectric element according to claim 1; and
    a control section configured to perform a predetermined processing, wherein the control section
        calculates a frequency of the applied pressure based on the first detection signal and the second detection signal,
        compares the calculated frequency with a predetermined threshold value,
        detects the pressure based on the second detection signal when it is determined that the calculated frequency is less than the predetermined threshold value, and
        detects the pressure based on the first detection signal when it is determined that the calculated frequency is equal to or greater than the predetermined threshold value.

6. The piezoelectric device according to claim 5, further comprising:
    a casing configured to accommodate the piezoelectric element, wherein
    the casing has a through hole formed in a portion facing the pressure detection section, and a partition wall that separates a portion facing the pressure detection section from a portion facing the acceleration detection section.

7. The piezoelectric device according to claim 6, further comprising:
    a casing configured to accommodate the piezoelectric element, wherein the casing has a through hole formed in a portion facing the pressure detection section, and a partition wall that separates a portion facing the pressure detection section from a portion facing the acceleration detection section.

8. A piezoelectric device for detecting pressure, comprising:
a piezoelectric element including a support member and a vibrating portion; and
a control section configured to perform a predetermined processing, wherein
the vibrating portion is disposed on the support member and has a piezoelectric film and an electrode film electrically connected to the piezoelectric film, a support region supported by the support member, and a plurality of vibration regions, one end portion side of which is supported by the support region, and the other end portion side of which is opposite to the one end portion is floating from the support member,
a plurality of the piezoelectric elements includes
a piezoelectric element having a vibration region in which a mass on the one end portion side is larger than the mass on the other end portion side and serves as a pressure detection section that outputs a first detection signal based on the charge of the piezoelectric film, and
a piezoelectric element having a vibration region in which a mass on the other end portion side is larger than the mass on the one end portion side and serves as an acceleration detection section that outputs a second detection signal based on the charge of the piezoelectric film, and
the control section
calculates a frequency of the applied pressure based on the first detection signal and the second detection signal,
compares the calculated frequency with a predetermined threshold value,
detects the pressure based on the second detection signal when it is determined that the calculated frequency is less than the predetermined threshold value, and
detects the pressure based on the first detection signal when it is determined that the calculated frequency is equal to or greater than the predetermined threshold value.

9. A manufacturing method of a piezoelectric element, the piezoelectric element including
a support member,
a vibrating portion configured to be disposed on the support member and having a piezoelectric film and an electrode film electrically connected to the piezoelectric film, and a support region supported by the support member, and a plurality of vibration regions, one end portion side of which is supported by the support region, and the other end portion side of which is opposite to the one end portion is floating from the support member, and
the plurality of vibration regions including
a first vibration region in which a mass on the one end portion side is heavier than the mass on the other end portion side, and which serves as a pressure detection section configured to output a first detection signal based on the charge of the piezoelectric film, and
a second vibration region in which the mass on the other end portion side is heavier than a mass on one end portion side, and which serves as an acceleration detection section configured to output a second detection signal based on the charge of the piezoelectric film,
wherein the first vibration region and the second vibration region are arranged adjacent to each other and have a same thickness in a thickness direction,
the method comprising:
preparing the support member;
forming the piezoelectric film and the electrode film on the support member;
forming a vibration region constituent part by forming a slit that penetrates the piezoelectric film and reaches the support member; and
forming a recess portion from a side of the support member opposite to the piezoelectric film side to float the vibration region constituent part so as to configure the vibration portion having the vibration region, wherein
when configuring the vibrating region by forming the slit, the slit is formed so that the vibration region, in which the mass on the one end portion side is made heavier than the mass on the other end portion side and serving as the pressure detection section, is configured and the vibration region, in which the mass on the other end portion side is made heavier than the mass on the one end portion side and serving as the acceleration detection section, is configured.

10. The manufacturing method of the piezoelectric element according to claim 9, further comprising:
arranging a temperature detection section configured to output a temperature detection signal corresponding to temperature in the support region.

11. The manufacturing method of the piezoelectric element according to claim 9, further comprising:
providing a control section configured to perform a predetermined processing, wherein
the control section is configured for
calculating a frequency of the applied pressure based on the first detection signal and the second detection signal,
comparing the calculated frequency with a predetermined threshold value,
detecting the pressure based on the second detection signal when it is determined that the calculated frequency is less than the predetermined threshold value, and
detecting the pressure based on the first detection signal when it is determined that the calculated frequency is equal to or greater than the predetermined threshold value.

* * * * *